(12) United States Patent
Zhou

(10) Patent No.: US 10,418,362 B2
(45) Date of Patent: Sep. 17, 2019

(54) SELF-HEATING TEST STRUCTURE

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventor: Fei Zhou, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/918,644

(22) Filed: Mar. 12, 2018

(65) Prior Publication Data

US 2018/0331099 A1 Nov. 15, 2018

(30) Foreign Application Priority Data

May 12, 2017 (CN) .......................... 2017 1 0331663

(51) Int. Cl.
*H01L 27/08* (2006.01)
*H01L 27/092* (2006.01)
*H01L 29/49* (2006.01)
*H01L 27/088* (2006.01)
*H01L 21/765* (2006.01)
(Continued)

(52) U.S. Cl.
CPC ...... *H01L 27/0886* (2013.01); *G01R 31/2875* (2013.01); *H01L 21/765* (2013.01); *H01L 21/76224* (2013.01); *H01L 21/76229* (2013.01); *H01L 21/823481* (2013.01); *H01L 22/30* (2013.01); *H01L 22/34* (2013.01);
(Continued)

(58) Field of Classification Search
CPC .................................................. H01L 27/0924
See application file for complete search history.

(56) References Cited

U.S. PATENT DOCUMENTS

2016/0020210 A1* 1/2016 Liaw ................. H01L 29/66545
257/369
2016/0329276 A1* 11/2016 Lin ....................... H01L 23/528

* cited by examiner

*Primary Examiner* — Moazzam Hossain
*Assistant Examiner* — Omar F Mojaddedi
(74) *Attorney, Agent, or Firm* — Kilpatrick Townsend & Stockton LLP

(57) ABSTRACT

A semiconductor device includes a substrate, a semiconductor fin on the substrate, first and second MOS devices on the substrate, and a dummy gate structure on the semiconductor fin and between the first and second MOS devices. The first dummy gate structure is operative to electrically isolate the first MOS device from the second MOS device when a first potential is applied to the dummy gate structure and a second potential is applied to the substrate. The first MOS device includes a first gate structure on the semiconductor fin, a first source and a first drain on opposite sides of the first gate structure and partially in the semiconductor fin. The second MOS device includes a second gate structure on the semiconductor fin, a second source and a second drain on opposite sides of the second gate structure and partially in the semiconductor fin.

8 Claims, 2 Drawing Sheets

(51) Int. Cl.
*H01L 21/66* (2006.01)
*H01L 23/34* (2006.01)
*H01L 21/762* (2006.01)
*G01R 31/28* (2006.01)
*H01L 21/8234* (2006.01)

(52) U.S. Cl.
CPC .... *H01L 23/345* (2013.01); *H01L 21/823437* (2013.01); *H01L 22/14* (2013.01)

SELF-HEATING TEST STRUCTURE

CROSS-REFERENCES TO RELATED APPLICATIONS

The present application claims priority to Chinese patent application No. 201710331663.5, filed with the State Intellectual Property Office of People's Republic of China on May 12, 2017, the content of which is incorporated herein by reference in its entirety.

FIELD OF THE INVENTION

The present application relates to semiconductor technology, and more particularly to a heat generating semiconductor device and method for detecting heat generated by a semiconductor device.

BACKGROUND OF THE INVENTION

As the critical dimension of metal oxide semiconductor field effect transistor (MOSFET) devices continues to shrink, the short channel effect becomes more problematic. Fin field effect transistor (FinFET) devices have better control capability of gates than planar MOSFET devices to effectively suppress the short channel effect. Thus, FinFET devices are generally used in the design of small-sized CMOS semiconductor devices.

However, the fin in a FinFET device is relatively narrow, which can cause serious self-heating problems in the FinFET device, thereby adversely affecting the device reliability. Self-heating increases device temperature and lattice vibration and causes decreased carrier mobility and reduced drive current in the device that may result in a degradation of device performance. At present, the detection of a device self-heating effect presents a big challenge.

BRIEF SUMMARY OF THE INVENTION

It is an object of the present disclosure to provide a heat generating semiconductor device and a method for detecting heat generation in a semiconductor device.

According to one aspect of the present disclosure, a semiconductor device includes a substrate, a semiconductor fin on the substrate, a first MOS device and a second MOS device on the substrate, and a dummy gate structure on the semiconductor fin and between the first MOS device and the second MOS device. The first dummy gate structure is operative to electrically isolate the first MOS device from the second MOS device when a first potential is applied to the dummy gate structure and a second potential is applied to the substrate. The first MOS device includes a first gate structure on the semiconductor fin, a first source and a first drain on opposite sides of the first gate structure and partially in the semiconductor fin. The second MOS device includes a second gate structure on the semiconductor fin, a second source and a second drain on opposite sides of the second gate structure and partially in the semiconductor fin.

In one embodiment, the semiconductor device also includes a plurality of second MOS devices, wherein adjacent second MOS devices share a common second source or a common second drain.

In one embodiment, the semiconductor device further includes a third MOS device on the substrate. The third MOS device includes a third gate structure on the semiconductor fin, and a third source and a third drain on opposite sides of the third gate structure and partially in the semiconductor fin. The semiconductor device also includes a second dummy gate structure on the semiconductor fin and between the first MOS device and the third MOS device. The second dummy gate structure is operative to electrically isolate the first MOS device from the third MOS device when a third potential is applied to the second dummy gate structure.

In one embodiment, the semiconductor device further includes a plurality of third MOS devices, wherein adjacent third MOS devices share a common third source or a common third drain.

In one embodiment, the first potential and the third potential have a same potential.

In one embodiment, the first MOS device and the second MOS device each are NMOS devices, and the first potential is less than or equal to the second potential.

In one embodiment, the first MOS device and the second MOS device each are PMOS devices, and the first potential is greater than the second potential.

In one embodiment, the substrate includes a first region and a second region surrounding the first region, the first region having an upper surface higher than an upper surface of the second region; the semiconductor fin is on the first region; and the semiconductor device further includes an isolation structure disposed on the second region and a portion of the first region that is not covered by the semiconductor fin.

Embodiments of the present disclosure also provide a method for detecting heat generated by a semiconductor device including a first MOS device and an active device on a substrate having a semiconductor fin disposed thereon. The method may include obtaining a first curve of a performance parameter of the first MOS device as a function of temperature when the active device is not operating, obtaining a second curve of the performance parameter of the first MOS device as a function of temperature when the active device is operating, and obtaining a heat generating condition of the active device according to a degree of deviation between the first curve and the second curve.

In one embodiment, the performance parameter includes one or more of a turn-off current, a subthreshold swing, a turn-on voltage, and a saturation current of the first MOS device.

In one embodiment, the MOS device on the substrate includes a first gate structure on the semiconductor fin, and a first source and a first drain on opposite sides of the first gate structure and partially in the semiconductor fin. The active device includes a second MOS device on the substrate, the second MOS device includes a second gate structure on the semiconductor fin, and a second source and a second drain on opposite sides of the second gate structure and partially in the semiconductor fin. The semiconductor device includes a first dummy gate structure on the semiconductor fin and between the first MOS device and the second MOS device. The method further includes applying a first potential to the first dummy gate structure and a second potential to the substrate to electrically isolate the first MOS device from the second MOS device.

In one embodiment, the active device includes a plurality of second MOS devices. Adjacent second MOS devices share a common second source or a second drain. The method further includes obtaining an average heat generation condition of the second MOS devices according to the heat generating condition of the active device.

In one embodiment, the active device further includes a third MOS device on the substrate, which includes a third gate structure on the semiconductor fin, and a third source and a third drain on opposite sides of the third gate structure and partially in the semiconductor fin, and the semiconductor device further includes a second dummy gate structure on the semiconductor fin and between the first MOS device and the third MOS device. The method further includes applying a third potential to the second dummy gate structure to electrically isolate the first MOS device from the third MOS device, and obtaining an average heat generating condition of the second MOS device and the third MOS device according to the heat generating condition of the active device.

In one embodiment, the first potential and the third potential have a same potential.

In one embodiment, the first MOS device and the second MOS device each are NMOS devices, and the first potential is less than or equal to the second potential.

In one embodiment, the first MOS device and the second MOS device each are PMOS devices, and the first potential is greater than the second potential.

In one embodiment, the substrate includes a first region and a second region surrounding the first region, the first region having an upper surface higher than an upper surface of the second region, and the semiconductor fin is on the first region. The method further includes forming an isolation structure on the second region and a portion of the first region not covered by the semiconductor fin to isolate heat generated by the active device The following detailed description together with the accompanying drawings will provide a better understanding of the nature and advantages of the present invention.

BRIEF DESCRIPTION OF THE DRAWINGS

The accompanying drawings, referred to herein and constituting a part hereof, illustrate embodiments of the disclosure. The drawings together with the description serve to explain the principles of the invention.

DETAILED DESCRIPTION OF THE INVENTION

Figure 1A:
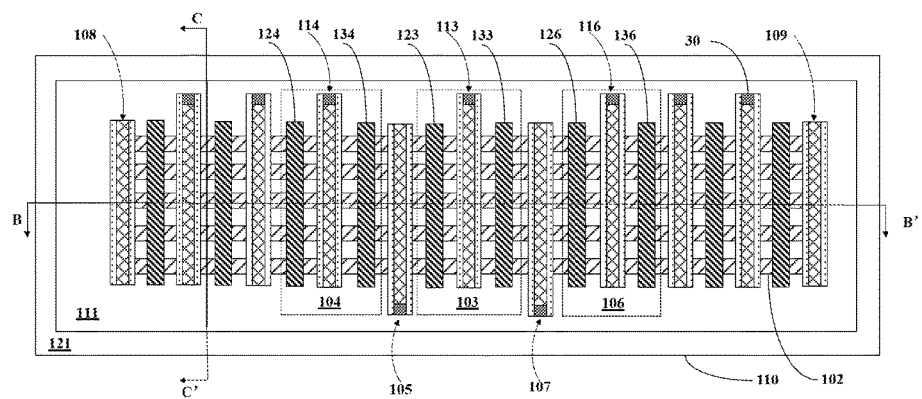
FIG. 1A is a top plan view of a semiconductor device according to one embodiment of the present disclosure.

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Embodiments of the present invention now will be described more fully hereinafter with reference to the accompanying drawings, in which embodiments of the invention are shown. This invention may, however, be embodied in many different forms and should not be construed as limited to the embodiments set forth herein.

Figure 1B:
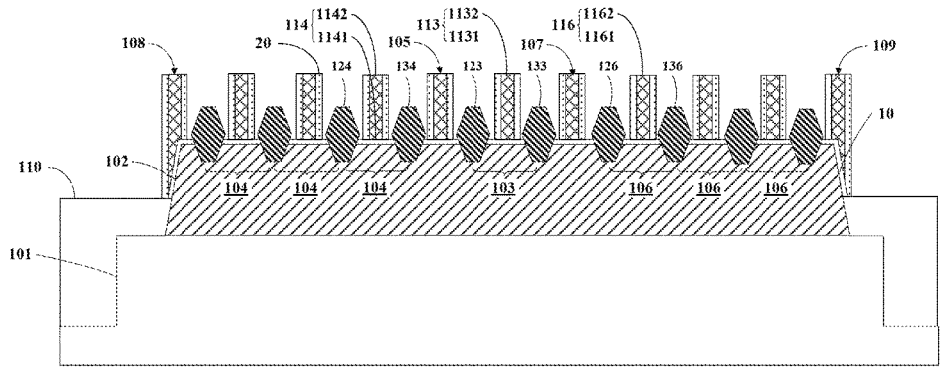
FIG. 1B is a cross-sectional view of the semiconductor device of FIG. 1A taken along the line B-B'.
Figure 1C:
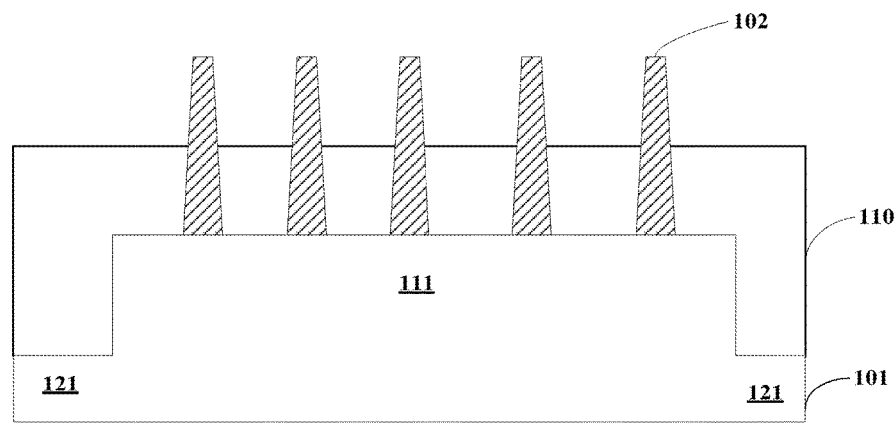
FIG. 1C is a cross-sectional view of the semiconductor device of FIG. 1A taken along the line C-C'.

FIG. 1A is a top plan view of a semiconductor device according to one embodiment of the present disclosure. FIG. 1B is a cross-sectional view of the semiconductor device of FIG. 1A taken along the line B-B'. FIG. 1C is a cross-sectional view of the semiconductor device of FIG. 1A taken along the line C-C'. A semiconductor device structure according to one embodiment of the present disclosure will be described in detail below with reference to FIGS. 1A, 1B, and 1C.

Referring to FIGS. 1A, 1B, and 1C, a semiconductor device may include substrate 101 and a semiconductor fin 102 on substrate 101. Substrate 101 may be an elemental semiconductor substrate, e.g., a silicon substrate or a germanium substrate, or a compound semiconductor substrate, e.g., a gallium arsenide substrate. Semiconductor fin 102 may include one semiconductor fin or a plurality of semiconductor fins that are spaced apart from each other by an isolation structure 110. Semiconductor fin 102 may include the same material as that of substrate 101, or semiconductor fin 102 may include a different material than that of substrate 101.

The semiconductor device may also include a first MOS device 103 for thermal detection or monitoring on substrate 101. Referring to FIGS. 1A and 1B, first MOS device 103 may include a first gate structure 113 on semiconductor fin 102, a first source 123 and a first drain 133 on opposite sides of first gate structure 113 and at least partially in semiconductor fin 102. In one embodiment, first gate structure 113 may include a first gate dielectric layer (e.g., a silicon oxide layer or a high-k dielectric layer) 1131 on semiconductor fin 102 and a first gate (e.g., a metal gate) 1132 on first gate dielectric layer 1131. First gate 1132 may have a contact 30. In addition, first gate structure 113 may also include a spacer layer 20 on opposite sides of first gate 1132.

The semiconductor device may further include a second MOS device 104 on substrate 101. Referring to FIGS. 1A and 1B, second MOS device 104 may include a second gate structure 114 on semiconductor fin 102, a second source 124 and a second drain 134 on opposite sides of second gate structure 114 and at least partially in semiconductor fin 102. In one embodiment, second gate structure 114 may include a second gate dielectric layer (e.g., a silicon oxide layer or a high-k dielectric layer) 1141 on semiconductor fin 102 and a second gate (e.g., a metal gate) 1142 on second gate dielectric layer 1141. In addition, second gate structure 114 may also include a spacer layer 20 on opposite sides of second gate 1142.

The semiconductor device may also include a first dummy gate structure 105 disposed between first MOS device 103 and second MOS device 104 on semiconductor fin 102. First dummy gate structure 105 may be similar to first gate structure 113 and second gate structure 114. That is, first dummy gate structure 105 may include a first dummy gate dielectric layer (e.g., a silicon oxide layer or a high-k dielectric layer) on semiconductor fin 102 and a first dummy gate (e.g., a polysilicon gate or a metal gate) on the first dummy gate dielectric layer. In addition, first dummy gate structure 105 may also include a spacer layer 20 on opposite sides of the first dummy gate.

Herein, in the case where a first potential is applied to first dummy gate structure 105, and a second potential is applied to substrate 101, first MOS device 103 and second MOS device 104 will be electrically isolated. Specifically, in the case where first MOS device 103 and second MOS device 104 each are NMOS devices, the first potential may be lower than or equal to the second potential, for example, the first potential may be a ground potential, i.e., the first dummy gate in first dummy gate structure 105 may be grounded. In the case where first MOS device 103 and second MOS device each are PMOS devices, the first potential may be higher than or equal to the second potential, for example, the first potential may be a supply voltage VDD, i.e., the first dummy gate in first dummy gate structure 105 may be connected to the supply voltage VDD.

First dummy gate structure 105 forms a MOS device with first source 123 and second drain 134. In the case where the first potential is applied to first dummy gate structure 105, and the second potential is applied to substrate 101, the MOS device is turned off, so that first MOS device 103 is electrically isolated from second MOS device 104.

As used herein, the term "the first potential is applied to the first dummy gate structure" means that the first potential is applied to the first dummy gate of the first dummy gate structure. Similarly, this definition also applies to the term "a third potential is applied to a third dummy gate structure" that will be described later below.

In the semiconductor device of the embodiment, the first MOS device and the second MOS device are disposed on the same semiconductor fin, and the first MOS device and the second MOS device are not isolated by any isolation structure, i.e., there is no isolation structure disposed between them. Heat generated at the time of operation of the second MOS device can be directly transferred to the first MOS device through the semiconductor fin. The first MOS device thus has a change in its performance parameter after receiving heat generated by the second MOS device in relation to its performance parameter before receiving the generated heat. In one embodiment, the performance parameter may include, but is not limited to, a turn-off current, a subthreshold swing, a turn-on voltage, or a saturation current. Therefore, it is possible to obtain a first curve of the performance parameter of the first MOS device according to the ambient temperature for the case that the second MOS device is not operating and a second curve of the performance parameter of the first MOS device according to the ambient temperature for the case that the second MOS device is operating. The self-heating condition (or heat generating condition) of the second MOS device can then be obtained by comparing a degree of deviation between these two curves.

In another embodiment, referring to FIGS. 1A and 1B, the semiconductor device may also include a plurality of second MOS devices 114, and adjacent second MOS devices 114 may share a second source 124 or a second drain 134. It should be noted that, while FIGS. 1A and 1B show that the electrode in second MOS device 104 is farther away from first dummy gate structure 105 as second source 124, and the electrode closer to first dummy gate structure 105 is second drain 134, it is arbitrarily chosen for describing the example embodiment and should not be limiting. It is to be understood that second source 124 may be the electrode that is closer to first dummy gate structure 105 and that second drain 134 may be the electrode that is farther away to first dummy gate structure 105.

In yet another embodiment, referring to FIGS. 1A and 1B, the semiconductor device may also include a third MOS device 106 on substrate 101 and a second dummy gate structure 107 disposed between first MOS device 103 and third MOS device 106 on semiconductor fin 102. Third MOS device 106 may include a third gate structure 116 on semiconductor fin 102, a third source 126 and a third drain 136 on opposite sides of third gate structure 116 and at least partially in semiconductor fin 102. In one embodiment, third gate structure 116 may include a third gate dielectric layer (e.g., a silicon oxide layer or a high-k dielectric layer) 1161 on semiconductor fin 102 and a third gate (e.g., a metal gate) 1162 on third gate dielectric layer 1161. In addition, third gate structure 116 may also include a spacer layer 20 on opposite sides of third gate 1162.

Second dummy gate structure 107 may be similar to first dummy gate structure 105. That is, second dummy gate structure 107 may include a second dummy gate dielectric layer (e.g., a silicon oxide layer or a high-k dielectric layer) on semiconductor fin 102 and a second dummy gate (e.g., a polysilicon gate or a metal gate) on the second dummy gate dielectric layer. In addition, second dummy gate structure 107 may also include a spacer layer 20 on opposite sides of the second dummy gate.

Herein, in the case where a third potential is applied to second dummy gate structure 107, and the second potential is applied to substrate 101, first MOS device 103 and third MOS device 106 will be electrically isolated. Specifically, in the case where first MOS device 103 and third MOS device 106 each are NMOS devices, the third potential may be lower than or equal to the second potential, for example, the second dummy gate of second dummy gate structure 106 may be connected to ground. In the case where first MOS device 103 and third MOS device 106 each are PMOS devices, the third potential may be higher than or equal to the second potential, for example, the second dummy gate of second dummy gate structure 107 may be connected to the supply voltage VDD. In the embodiment, the third potential may be the same as the first potential.

In yet another embodiment, the semiconductor device may include a plurality of third MOS devices 106, where two adjacent third MOS devices share a common third source 126 or a common third drain 136.

In some embodiments, the semiconductor device may also include a third dummy gate structure 108 and a fourth dummy gate structure 109 on opposite ends of semiconductor fin 102 to facilitate control of the form (morphology) of the source or drain that are adjacent to the third or fourth dummy gate structure. In some embodiments, semiconductor fin 102 may include a plurality of fins arranged substantially in parallel so that the first MOS device, the second MOS device, and the third MOS device each have a multi-finger structure.

In addition, referring to FIGS. 1A and 1C, in order to minimize the loss of heat generated by the MOS devices on substrate 101, for example, second MOS device 104, third MOS device 106 to facilitate detection and monitoring of the device heat generation, substrate 101 may be configured to include a first region 111 and a second region 121 surrounding first region 111, first region has an upper surface that is higher than the upper surface of second region 121. In this case, semiconductor fin 102 is disposed on first region 111. The semiconductor device may also include an isolation structure 110 disposed on second region 121 and a portion of first region 111 that is not covered by semiconductor fin 102. Isolation structure 110 provides a deep isolation of the devices (including first MOS device 103, second MOS device 104, third MOS device 106) on first region 111 to reduce the heat loss of these devices (i.e., by isolating heat generated by the MOS devices), thereby improving the accuracy of the heat detection and monitoring.

Figure 2:
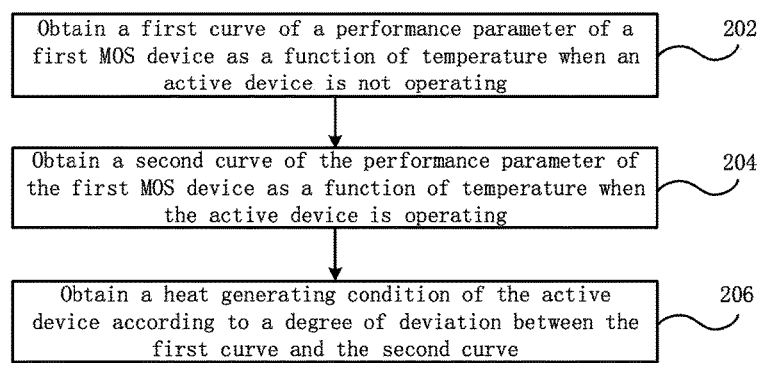
FIG. 2 is a simplified flowchart of a method for detecting heat of a semiconductor device according to one embodiment of the present disclosure.

FIG. 2 is a simplified flowchart of a method for detecting heat generated by a semiconductor device according to one embodiment of the present disclosure. The semiconductor device may be one of the embodiments described above.

Referring to FIG. 2, the method may include:

Step 202: obtaining a first curve of a performance parameter of a first MOS device as a function of temperature in the case where an active device is not operating.

Herein, the first MOS device is the first MOS device for heat detecting and monitoring. The active device may be, e.g., the second MOS device and/or the third MOS device. The performance parameter may include one or more of a turn-off current, a subthreshold swing, a turn-on voltage, and a saturation current. For example, a first curve is a set of values of the performance parameter of the first MOS device taken at various discrete temperature points (e.g., various ambient temperatures) when the active device is not operating.

Step 204: obtaining a second curve of the performance parameter of the first MOS device as a function of temperature in the case where the active device is operating.

In the case where the active device is operating, the heat generated by the active device is transferred to the first MOS device. At a same temperature, the performance parameter of the first MOS device when in operation will vary as compared to its performance parameter when under non-operating conditions. For example, a second curve is a set of values of the performance parameter of the first MOS device taken at various discrete temperature points when the active device is operating.

Step 206: obtaining a heat generating condition of the active device according to a degree of variation between the first curve and the second curve.

In one embodiment, when the active device is not operating, the first curve is the measured values of a performance parameter of the first MOS device as a function of ambient temperature. The ambient temperature as used herein may be, e.g., the temperature of a test machine. In one exemplary embodiment, the test machine can be gradually heated so that the temperature of the test machine is at some discrete temperature values (e.g., 5° C., 15° C., 25° C., 50° C., 80° C., 120° C., 150° C., etc.), the values of the performance parameter of the first MOS device corresponding to these temperature values are taken to obtain a first curve of the performance parameter of the first MOS device as a function of the ambient temperature. Thereafter, when the active device is operating, the values of the performance parameter of the first MOS device at these temperature values are taken again to obtain a second curve of the performance parameter of the first MOS device as a function of the ambient temperature. By comparing the degree of variation between the first curve and the second curve, the heat generating condition of the active device can be evaluated or obtained.

In one embodiment of a method for detecting the heat generating condition of a device, the method may be performed using a semiconductor device described in any one of the above embodiments. In some embodiments, the substrate of the semiconductor device may include a first region and a second region that surrounds the first region. The first region has an upper surface that is higher than an upper surface of the second region. The method may include forming (e.g., by a deposition process) an isolation structure on the second region and on a portion of the first region that is not covered by the semiconductor fin to isolate heat generated by the active device (i.e., to reduce heat loss and improve the heat detection).

The active device may include a second MOS device 104 in a semiconductor device as described in any one of the above embodiments, and the first MOS device may be first MOS device 103 in the above-described semiconductor device. At the time of heat generating testing, a first potential may be applied to first dummy gate structure 105, and a second potential may be applied to substrate 101, so that first MOS device 103 is electrically isolated from second MOS device 104. In one example embodiment, in the case where the first MOS device and the second MOS device each are NMOS devices, the first potential may be lower than or equal to the second potential. In the case where the first MOS device and the second MOS device each are PMOS devices, the first potential may be higher than the second potential.

The embodiment can determine a heat generating condition of second MOS device 104 by comparing a degree of variation between the first curve and the second curve of the performance parameter as a function of temperature.

In another embodiment of a method for detecting a heat generating condition of an active device, the active device may include a plurality of second MOS devices 104, and adjacent second MOS devices 104 share second source 124 or second drain 134.

This embodiment obtains the heat generating condition of a plurality of second MOS devices of the active device by comparing the degree of variation between the first curve and the second curve of the performance parameter as a function of temperature. Further, an average heat generating condition of the plurality of second MOS devices 104 can be obtained according to the heat generating condition of the active device.

In yet another embodiment of a method for detecting a heat generation condition of an active device, the above-described active device may further include one or more third MOS devices 106 and a second dummy gate structure 107 disposed between first MOS device 103 and third MOS devices 106. Adjacent third MOS devices 106 may share third source 126 or third drain 136. At the time of heat generating testing, a third potential may be applied to second dummy gate structure 107 to electrically isolate first MOS device 103 from third MOS devices 106. In one embodiment, the third potential may be the same as the first potential.

The embodiment obtains the heat generation condition of the active device, i.e., second MOS device 104 and third MOS device 106 by comparing the degree of variation between the first curve and the second curve of the performance parameter as a function of temperature. Further, an average heat generating condition of the active device, i.e., the second MOS device and the third MOS device, can be obtained according to the heat generating condition of the active device.

Embodiments of the present disclosure thus describe in detail a semiconductor device and a method for detecting a heat generation condition of the semiconductor device. In order to avoid obscuring the present disclosure, some well-known process steps and structure configurations are not described in detail.

It is to be understood that the above described embodiments are intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A semiconductor device, comprising:
   a substrate;
   a semiconductor fin on the substrate;
   a first MOS device on the substrate, comprising:
      a first gate structure on the semiconductor fin; and
      a first source and a first drain on opposite sides of the first gate structure and partially in the semiconductor fin;
   a second MOS device on the substrate, comprising:
      a second gate structure on the semiconductor fin; and
      a second source and a second drain on opposite sides of the second gate structure and partially in the semiconductor fin; and
   a first dummy gate structure on the semiconductor fin and between the first MOS device and the second MOS device, the first dummy gate structure being operative to electrically isolate the first MOS device from the second MOS device when a first potential is applied to the first dummy gate structure and a second potential is applied to the substrate.

2. The semiconductor device of claim 1, further comprising a plurality of second MOS devices, wherein adjacent second MOS devices share a common second source or a common second drain.

3. The semiconductor device of claim 2, further comprising:
   a third MOS device on the substrate, comprising:
      a third gate structure on the semiconductor fin; and
      a third source and a third drain on opposite sides of the third gate structure and partially in the semiconductor fin; and
   a second dummy gate structure on the semiconductor fin and between the first MOS device and the third MOS device, the second dummy gate structure being operative to electrically isolate the first MOS device from the third MOS device when a third potential is applied to the second dummy gate structure.

4. The semiconductor device of claim 3, further comprising a plurality of third MOS devices, wherein adjacent third MOS devices share a common third source or a common third drain.

5. The semiconductor device of claim 3, wherein the first potential and the third potential have a same potential.

6. The semiconductor device of claim 1, wherein the first MOS device and the second MOS device each are NMOS devices; and
   the first potential is less than or equal to the second potential.

7. The semiconductor device of claim 1, wherein the first MOS device and the second MOS device each are PMOS devices; and
   the first potential is greater than the second potential.

8. The semiconductor device of claim 1, wherein:
   the substrate comprises a first region and a second region surrounding the first region, the first region having an upper surface higher than an upper surface of the second region;
   the semiconductor fin is on the first region;
   the semiconductor device further comprises an isolation structure disposed on the second region and a portion of the first region not covered by the semiconductor fin.

* * * * *